US008259488B1

(12) United States Patent
Tedrow et al.

(10) Patent No.: US 8,259,488 B1
(45) Date of Patent: Sep. 4, 2012

(54) PHASE-CHANGE MEMORY TEMPERATURE SENSITIVE DETECTOR

(75) Inventors: Kerry Dean Tedrow, Folsom, CA (US); Jahanshir Javanifard, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 164 days.

(21) Appl. No.: 12/464,011

(22) Filed: May 11, 2009

(51) Int. Cl.
*G11C 11/00* (2006.01)
(52) U.S. Cl. .................. 365/163; 365/148; 365/211
(58) Field of Classification Search .................. 365/163, 365/211, 148
See application file for complete search history.

(56) References Cited

U.S. PATENT DOCUMENTS

| | | | |
|---|---|---|---|
| 7,882,455 B2 * | 2/2011 | Habib et al. .................. 716/100 |
| 2004/0151023 A1 * | 8/2004 | Khouri et al. .................. 365/163 |
| 2007/0280023 A1 * | 12/2007 | Happ et al. .................. 365/222 |
| 2011/0096594 A1 * | 4/2011 | Franceschini et al. ........ 365/163 |

* cited by examiner

*Primary Examiner* — Vu Le
*Assistant Examiner* — Han Yang
(74) *Attorney, Agent, or Firm* — Schwegman, Lundberg & Woessner, P.A.

(57) ABSTRACT

A Phase-Change Memory (PCM) having a temperature detector with a dedicated PCM bit programmed to an amorphous state and a circuit to determine that the dedicated PCM bit is no longer in the amorphous state. A temperature exposure signal is asserted to indicate that a high temperature has altered PCM device programming integrity.

19 Claims, 3 Drawing Sheets

PHASE-CHANGE MEMORY TEMPERATURE SENSITIVE DETECTOR

BACKGROUND OF THE INVENTION

The Phase-Change Memory (PCM) technology is a promising alternative to the current nonvolatile memory mainstream constituted by the Flash technology. PCM manufacturing includes testing, packaging and soldering, referred to as back end processing. The back end processing includes a high-temperature step that causes PCM cell(s) previously programmed to the high-resistance amorphous state to change to the low-resistance crystalline state. This state change affects data retention, and therefore, it is desirable to determine if a PCM memory device was exposed to a high-temperature step where data loss would have occurred.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
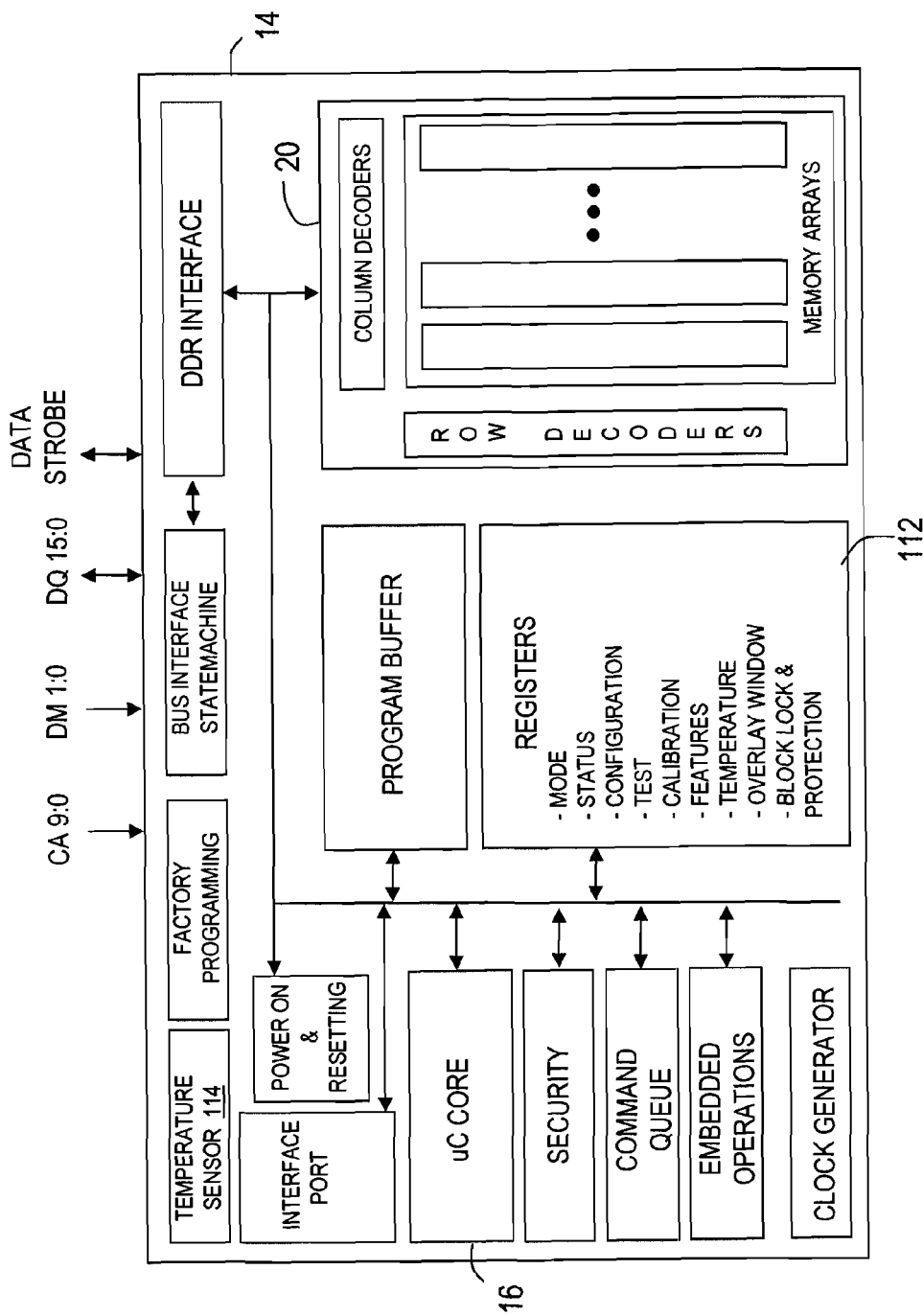
FIG. 1 is block diagram of a memory device having a temperature sensor for determining whether a Phase-Change Memory (PCM) memory device has undergone a temperature cycle that affects the reliability of PCM arrays in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

FIG. 1 illustrates multiple banks of a Phase-Change Memory (PCM) 20 in a memory device 14. The PCM arrays may also be referred to as Phase-Change Random Access Memory (PRAM or PCRAM), Ovonic Unified Memory (OUM) or Chalcogenide Random Access Memory (C-RAM). The arrays of PCM cells include alloys of elements of group VI of the periodic table, elements such as Te or Se that are referred to as chalcogenides or chalcogenic materials. When the memory arrays use chalcogenides advantageously in phase change memory cells to provide data retention, the data remains stable even after the power is removed from the nonvolatile memory. Taking the phase change material as $Ge_2Sb_2Te_5$ for example, two phases or more are exhibited having distinct electrical characteristics useful for memory storage.

The chalcogenide chemistry uses the application of heat to melt the material for the two energy states for any particular bit. However, the high energy bands of the phase change material may bring about instability in the retention of data when the memory device is subjected to external heat. For example, the high resistance amorphous state has sufficient activation energy as to be susceptible to relaxation into the low-resistance crystalline state with the application of external heat, resulting in a loss of data.

This loss of stored data is problematic for a phase-change memory device. For instance, after subjecting memory device 14 to high-temperatures, the boot code for operating the uC that resides in PCM 20 may not be reliable and the code should not be made available. Thus, it is important to determine whether PCM 20 was exposed to a high-temperature step so that the integrity of the data can be verified, and if necessary, the options initiated for obtaining a new boot code. These options may include uploading a new code to the system through an interface, where after installation the in-factory programming data may also be transferred to PCM 20.

Figure 2:
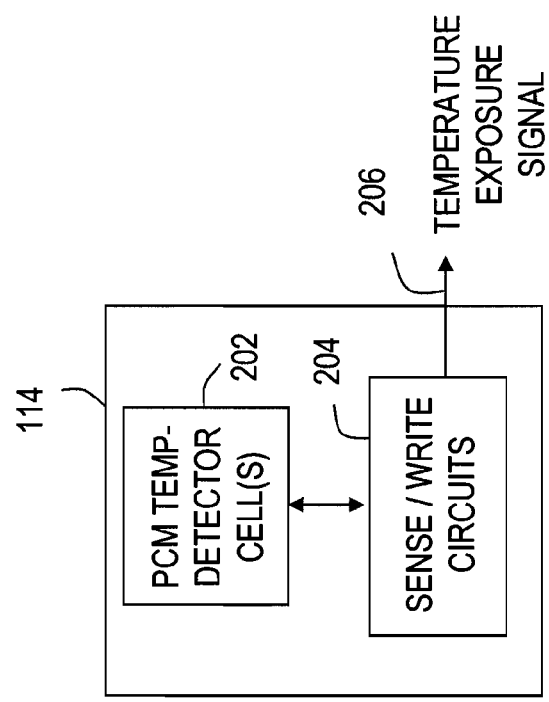
FIG. 2 illustrates PCM cell(s) dedicated to high-temperature detection.

A temperature sensor block 114 may be used to detect high-temperature exposure of memory device 14. FIG. 2 illustrates temperature sensor block 114 having a PCM temp-detector cell(s) 202 and a sense/write circuit block 204 in accordance with the present invention. The dedicated PCM bit, or alternatively, the multiple memory cell(s) in PCM temp-detector cell(s) 202 are dedicated to high-temperature detection, and in this embodiment are manufactured to be the same as the PCM cells in the memory arrays of PCM 20. Thus, temperature affects on cell resistance as measured in temperature sensor 114 are deterministic of temperature effects on PCM 20 that result in memory cell data loss. PCM temp-detector cell(s) 202 and sense/write circuitry 204 are a temperature-detector to detect PCM memory cell resistance changes that may be detrimental to the operation of memory device 14.

After the final high-temperature manufacturing step in the semiconductor manufacturing process, the PCM cell(s) in PCM temp-detector cell(s) 202 are programmed to the high-resistance amorphous (reset) state. An algorithm, or in an alternate embodiment, a logic test block may be used to activate sense/write circuitry 204. When activated, the PCM cell(s) in PCM temp-detector cell(s) 202 are tested and a PCM cell resistance value is determined that is indicative of at least one past history high temperature event of memory device 14. In one embodiment this test occurs at least once during power-up of memory device 14, although the frequency of testing and the use of other events may be used to trigger the testing of the PCM cell(s) of PCM temp-detector cell(s) 202 without limiting the scope of the present invention.

If the resistance value is below a preset level, then it is determined that memory device 14 has been subjected to a high temperature that has altered the integrity of the high-resistance amorphous state. In this case the temperature exposure signal 206 is asserted to indicate unreliable data storage within PCM 20. A special memory command may be used to reset the temp-detector cell(s), thereby resetting the temp-detector for future use. On the other hand, if the resistance value is not below the preset level, then memory device 14 has not undergone a high temperature that has altered the high-resistance amorphous state.

Figure 3:
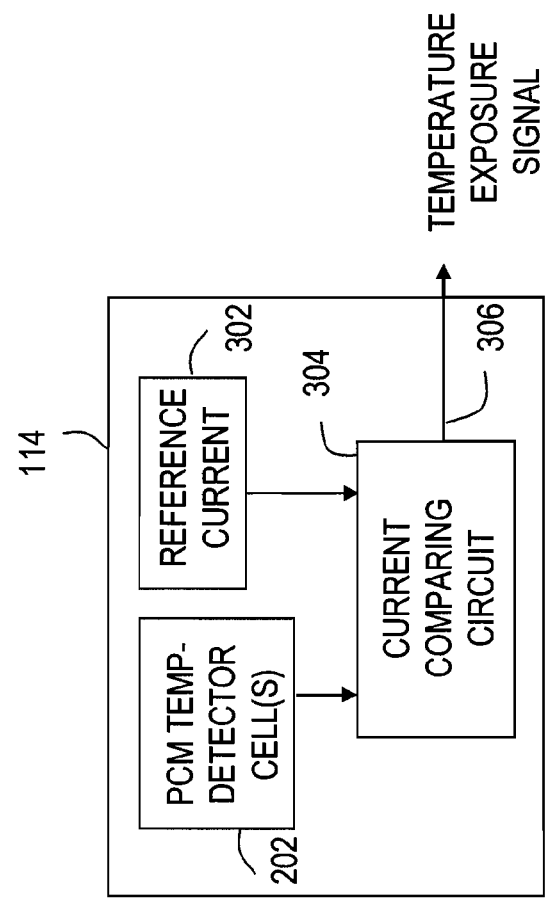
FIG. 3 illustrates PCM temperature detector cell(s) conducting a current that is compared against a pre-defined reference current to determine whether the cell resistance has substantially changed.

FIG. 3 illustrates another embodiment for testing the cell resistance of a PCM temp-detector cell(s) 202 by using current comparing circuit 304 to compare a cell current to a pre-defined reference current 302. If memory device 14 has been exposed to a high-temperature the original programmed high resistance state has been altered to a lower resistance. The cell current conducted by the PCM cell then exceeds the reference current and the temperature exposure signal 306 is asserted to indicate unreliable data storage within PCM 20. If the resistance value has not substantially fallen, the current conducted by the PCM cell remains below the reference current level, then the temperature exposure signal 306 is not asserted and memory device 14 has not undergone a high temperature that has altered the high-resistance amorphous state. As before, a special memory command may be used to reset the temp-detector cell(s), thereby resetting the temp-detector for future use.

Either embodiment as shown in FIG. 2 or FIG. 3 may test multiple PCM cells in PCM temp-detector cell(s) 202. This robust implementation essentially averages the resistance values determined for each PCM cell being measured, and thereby, reduces the effects of variations in the manufacturing processing. The current conducted by each PCM cell may be compared to a reference current. When the number of PCM cells that conduct a current that is greater than the reference current exceeds a pre-defined threshold, then memory device 14 has undergone a high-temperature exposure and the temperature exposure signal is asserted, i.e., signal 206 in FIG. 2 or signal 306 in FIG. 3.

Figure 4:
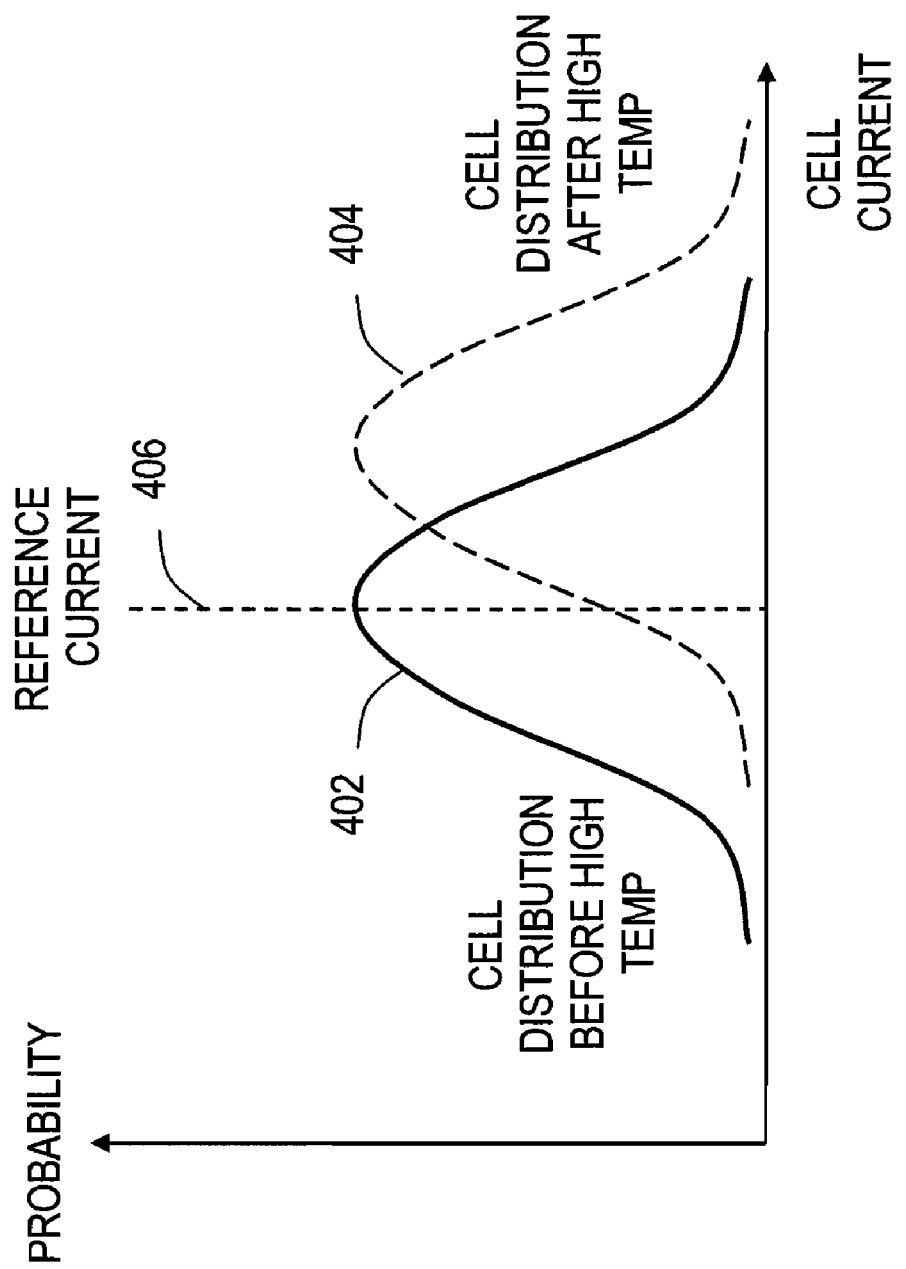
FIG. 4 shows cell resistance distributions for PCM memory cells programmed to the high-resistance amorphous state and the shifted distribution to the low-resistance crystalline state following a high-temperature exposure of the memory device.

FIG. 4 provides an example of resistance distributions for PCM memory cells programmed to the high-resistance amorphous state 402 and the shifted distributions to the low-resistance crystalline state 404 following a high-temperature exposure of memory device 14 (provided by way of example as a temperature of approximately 175 degrees Celsius). As can also be seen in the figure, the temp-detectors described in the various embodiments can easily detect the low current for a PCM cell programmed to the high-resistance amorphous state 402 and the high current for low-resistance crystalline state 404. By design, the low current conducted by the PCM cell in the amorphous state is lower than a reference current 406, and clearly the shifted higher conduction current is greater than the reference current 406 after exposing memory device 14 to the high temperature. It should be noted that in some cases a data refresh operation may be initiated and/or an ECC operation run to recover data if data loss is determined to be marginal.

By now it should be apparent that embodiments of the present invention provide information about the reliability of memory storage that may be subjected to high temperatures. These methods, circuitry, and techniques predict when chalcogenide PCM devices that have experienced a high temperature should be refreshed or uploaded with new data.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A Phase-Change Memory (PCM) device, comprising:
at least one memory array having a plurality of PCM memory cells; and
one or more dedicated PCM temperature detector cells to make a determination whether the PCM device has been subjected to a predetermined temperature sufficient to alter a programmed value of a high-resistance amorphous state of the plurality of PCM memory cells to a lower resistance state, the alteration being indicative of unreliable data storage in the PCM memory cells.

2. The PCM device of claim 1, wherein the one or more dedicated PCM temperature detector cells is programmed to a high-resistance amorphous state by a manufacturer following semiconductor processing.

3. The PCM device of claim 1, wherein the one or more dedicated PCM temperature detector cells is programmed to a high-resistance amorphous state when the PCM device is powered on.

4. The PCM device of claim 1, further comprising a sense/write circuit, wherein the one or more dedicated PCM temperature detector cells and the sense/write circuit form a temperature detector to determine an existence of a past history indicative of the PCM device having been subjected to at least the predetermined temperature.

5. The PCM device of claim 4, wherein the temperature detector is configured to detect PCM memory cell resistance changes that are deterministic of temperature effects on the PCM device that result in memory cell data loss in the PCM device.

6. The PCM device of claim 4, wherein the sense/write circuit asserts a temperature exposure signal when the temperature detector determines that the PCM device has been subjected to at least the predetermined temperature.

7. The PCM device of claim 1, wherein the one or more dedicated PCM temperature detector cells have been manufactured using a same processes as the plurality of PCM memory cells of the PCM device.

8. A Phase-Change Memory (PCM) device, comprising:
at least one PCM array of memory cells;
a dedicated PCM bit; and
a compare circuit to receive a current from the dedicated PCM bit to compare against a reference current to assert a temperature exposure signal based on a determination that at least one of the memory cells was subjected to a temperature sufficient to alter a programmed value of a high-resistance amorphous state of the at least one of the memory cells to a lower resistance state sufficient to cause unreliable data storage in the at least one of the memory cells.

9. The PCM device of claim 8, wherein the dedicated PCM bit and the compare circuit form a temperature detector circuit.

10. The PCM device of claim 9 configured to receive a memory command to program the dedicated PCM bit to a high resistance state that resets the temperature detector circuit for future use.

11. The PCM device of claim 8, wherein the assertion of the temperature exposure signal indicates that the PCM has been subjected to a high temperature that has altered PCM device programmed integrity of the high-resistance amorphous state of the PCM device.

12. The PCM device of claim 8, wherein the temperature exposure signal not being asserted indicates that the PCM has not undergone a high temperature that has altered an amorphous state of the PCM device.

13. A Phase-Change Memory (PCM) device, comprising:
   a PCM array; and
   a PCM temperature detector having a dedicated PCM bit programmed to an amorphous state and a circuit to determine whether the dedicated PCM bit is no longer in the amorphous state based on exposure to a temperature sufficient to alter a programmed value of a high-resistance amorphous state of the at least one of a plurality of memory cells in the PCM array to a lower resistance state sufficient to cause unreliable data storage in the PCM array and to assert a temperature exposure signal.

14. The PCM device of claim 13, wherein the temperature exposure signal indicates that the PCM device has been subjected to the temperature that has altered integrity of the high-resistance amorphous state of the PCM array.

15. The PCM device of claim 13, wherein the PCM device and the circuit form a temperature detector that tests amorphous state stability when triggered by the PCM device.

16. The PCM device of claim 15, wherein the trigger is a power-on sequence of the PCM device.

17. The PCM device of claim 13, further comprising multiple dedicated PCM cells in the PCM temperature detector to detect a temperature at least equal to the temperature that alters the programmed value of a high-resistance amorphous state of the PCM device.

18. The PCM device of claim 17, wherein the multiple dedicated PCM cells have been manufactured using a same process as PCM cells in memory arrays of the PCM device.

19. The PCM device of claim 13, the device being configured to initiate a data refresh operation to recover data when, during operation of the PCM device, data integrity is determined to be marginal based on a determination of the alteration of the programmed value of a high-resistance amorphous state of the PCM device.

\* \* \* \* \*